(12) United States Patent
Eidt

(10) Patent No.: US 9,338,920 B2
(45) Date of Patent: May 10, 2016

(54) MOUNTING DEVICE FOR ATTACHING MECHANICAL, ELECTRICAL AND/OR ELECTRONIC MODULES

(71) Applicant: GM GLOBAL TECHNOLOGY OPERATIONS LLC, Detroit, MI (US)

(72) Inventor: Siegfried Eidt, Ruesselsheim (DE)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 236 days.

(21) Appl. No.: 14/104,052

(22) Filed: Dec. 12, 2013

(65) Prior Publication Data

US 2014/0160718 A1    Jun. 12, 2014

(30) Foreign Application Priority Data

Dec. 12, 2012   (DE) .......................... 10 2012 024 275

(51) Int. Cl.
| | |
|---|---|
| *B60R 11/02* | (2006.01) |
| *H05K 7/14* | (2006.01) |
| *B60R 11/04* | (2006.01) |
| *B60R 11/00* | (2006.01) |

(52) U.S. Cl.
CPC ........ *H05K 7/14* (2013.01); *B60R 11/02* (2013.01); *B60R 11/04* (2013.01); *B60R 2011/0026* (2013.01)

(58) Field of Classification Search
CPC ............. F16B 21/09; B60R 1/04; B60R 1/12; B60R 11/04; B60R 11/12; B60R 11/02; B60R 2011/0026; H05K 7/14
USPC .......................... 248/221.12, 222.41, 223.21
See application file for complete search history.

(56) References Cited

U.S. PATENT DOCUMENTS

| | | | | |
|---|---|---|---|---|
| 3,367,082 | A * | 2/1968 | Meyer .................... | F16B 5/128 24/297 |
| 4,878,639 | A * | 11/1989 | Tempco ................... | H01R 9/16 248/225.11 |
| 5,377,948 | A * | 1/1995 | Suman ..................... | B60R 1/04 248/549 |
| 6,410,851 | B1 * | 6/2002 | Lamar ..................... | H02G 3/10 174/66 |
| 2007/0228238 | A1 * | 10/2007 | Engel ..................... | H02G 3/123 248/222.41 |
| 2007/0228247 | A1 * | 10/2007 | Tanaka .................... | B60R 1/04 248/476 |

FOREIGN PATENT DOCUMENTS

| | | | | |
|---|---|---|---|---|
| DE | 3414845 | A1 * | 6/1985 | ............. F16B 9/023 |
| DE | 10211444 | A1 | 10/2003 | |
| DE | 10328468 | A1 | 1/2005 | |
| DE | 10355205 | A1 | 7/2005 | |
| DE | 102004004129 | A1 | 9/2005 | |
| DE | 102010026218 | A1 * | 1/2012 | ............. F16B 21/09 |
| EP | 0018240 | A1 | 10/1980 | |
| JP | 11078717 | A | 3/1999 | |
| WO | 2004004291 | A1 | 1/2004 | |

OTHER PUBLICATIONS

German Patent Office, German Patent Search Report for Application No. 102012024275.1, dated Oct. 1, 2013.

* cited by examiner

*Primary Examiner* — Corey Skurdal
(74) *Attorney, Agent, or Firm* — Ingrassia Fisher & Lorenz PC

(57) ABSTRACT

A mounting device is provided for attaching a mechanical, electrical and/or electronic module to the vehicle window pane. The mounting device includes, but is not limited to a front side and a rear side and at least one laterally springy pin opening. The pin opening can receive a pin element that is designed to attach the mounting device with its front side to the vehicle window pane.

17 Claims, 5 Drawing Sheets

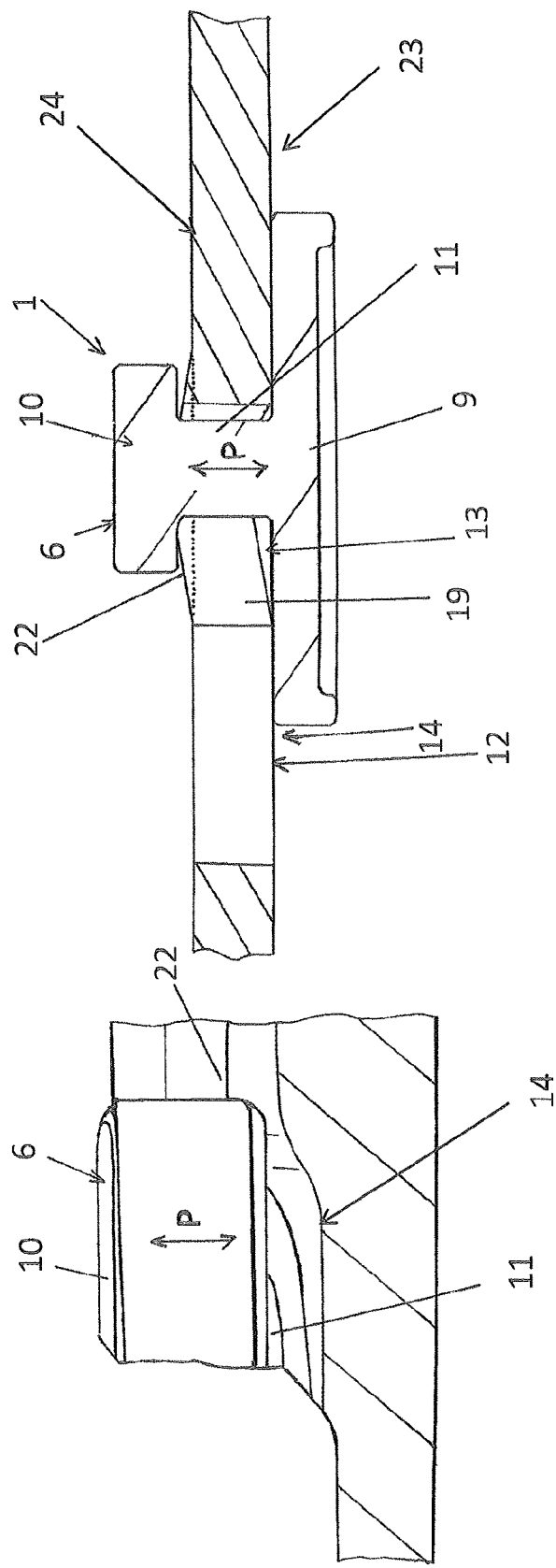

MOUNTING DEVICE FOR ATTACHING MECHANICAL, ELECTRICAL AND/OR ELECTRONIC MODULES

CROSS-REFERENCE TO RELATED APPLICATION

This application claims priority to German Patent Application No. 10 2012 024 275.1, filed Dec. 12, 2012, which is incorporated herein by reference in its entirety.

TECHNICAL FIELD

The technical field relates to a mounting device for attaching holders to a vehicle window pane in a movement-free and vibration-free manner.

BACKGROUND

The DE 103 55 205 A1 describes a mounting arrangement for a camera module in a vehicle. The camera module comprises a camera module holder that is connected with the windscreen via an attaching element. When manufacturing a windscreen, one or several attaching elements for a mounting arrangement are glued to the windscreen.

In view of the foregoing, at least one object is to provide an improved mounting device that in particular is easy to attach to a vehicle window pane and counteracts rattling of the mounting device in the vehicle during driving. In addition, other objects, desirable features and characteristics will become apparent from the subsequent summary and detailed description, and the appended claims, taken in conjunction with the accompanying drawings and this background.

SUMMARY

A mounting device is provided for attaching at least one mechanical, electrical and/or electronic module to a vehicle window pane. The mounting device comprises a front side and a rear side and at least one laterally springy pin opening. The pin opening can receive a pin element which is configured to attach the mounting device with its front side to the vehicle window pane. A mechanical module may, for example, be a rear-view mirror unit which can only be manually adjusted. An electrical and/or electronic module may e.g. be a rear-view mirror unit which is electrically adjustable, or an electrical and/or electronic sensor unit, such as a light sensor etc.

A vehicle, in particular a motor vehicle, with a vehicle window pane, electrical and electronic modules, is provided with a mounting device for attaching electrical and electronic modules to the vehicle window pane. In one embodiment, the pin opening is configured so as to be springy towards the front side and the rear side of the mounting device. In this way it is possible, during attaching the mounting device to a vehicle window pane, to compensate for differences in tolerance in direction of the front side and rear side of the mounting device.

In a further embodiment the pin opening comprises a first portion configured to insert the pin element and a second portion connected with the first portion in longitudinal direction, which is configured to receive the pin element. The first portion is, for example, configured such as to allow a base portion of the pin element to be passed through. The second portion comprises, e.g., a width which is smaller than the diameter of the base portion and smaller than the diameter of a head portion of the pin element. The base portion and the head portion may be any given shape such as a round, oval and/or angular shape. A web of the pin element can be inserted into the second portion that connects the head and base portions. Preferably, the length of the second portion is equal to or larger than the diameter of the web. This will allow the mounting device to be attached, e.g., to the vehicle window pane by gluing and to be safely held in position by the base portion.

According to an embodiment, the width of the second portion is equal to the width or the diameter of the web or forms a transitional fit together with the same. As a result, inadvertent rattling and squeaking as well as an inadvertent movement of the mounting device during driving are prevented or at least reduced.

In a further embodiment the mounting device comprises a recess on one or two opposite sides of the pin opening in longitudinal direction of the pin opening, thereby forming a web portion between the pin opening and the recess that makes the pin opening springy. The respective web portion allows the pin opening to be laterally springy or to move towards the right or the left side of the mounting device. This makes it very easy to compensate for differences in tolerance such as manufacturing tolerances, while nevertheless ensuring that attachment of the mounting device remains easy.

In one embodiment the respective recess extends at least along a partial length or across the entire length of the second portion of the pin opening. In a further embodiment the respective recess extends additionally in longitudinal direction of the pin opening beyond one end or both ends of the second portion of the pin opening. In yet a further embodiment the two recesses extend beyond the end of the second portion facing away from the first portion, wherein the two web portions formed by the two recesses merge at the end of the second portion to form a joint web portion.

In another embodiment the recess in the mounting device is provided so as to partially encircle the pin opening or partially encircle the pin opening in circumferential direction, thereby forming a web portion partially encircling the pin opening between the pin opening and the recess, which allows the pin opening of the mounting device to be springy. The recess may be configured so as to merely encircle the second portion or to encircle it in circumferential direction, or alternatively so as to encircle the second portion and partially encircle the first portion or so as to be encircling in circumferential direction.

According to one embodiment at least one web portion may be configured so as to be even or planar. Additionally or alternatively at least one web portion may be arched towards the front or the rear side of the mounting device, where the web portion may be springy in direction of the front side and rear side of the mounting device. Again, this allows differences in tolerance to be compensated for both in direction of the front side and the rear side of the mounting device. Preferably the mounting device comprises at least one additional receptacle for receiving a sensor, a camera or the like. In one preferred design the mounting device comprises at least one damping element.

The above embodiments are combinable with one another in any given meaningful way. Further possible embodiments, further developments and implementations also comprise not explicitly mentioned combinations of characteristics previously mentioned or mentioned in the following with reference to the embodiments. In particular the expert will add individual aspects as improvements or amendments to the respective basic form of the embodiments.

BRIEF DESCRIPTION OF THE DRAWINGS

The present invention will hereinafter be described in conjunction with the following drawing figures, wherein like numerals denote like elements, and:

FIG. 7 shows a sectional view of the springy pin opening of the mounting device according to FIG. 5 and FIG. 6 and the received pin element received; and FIG. 8 shows a portion of the springy pin opening and its pin element according to FIG. 7.

DETAILED DESCRIPTION

The following detailed description is merely exemplary in nature and is not intended to limit application and uses. Furthermore, there is no intention to be bound by any theory presented in the preceding background or summary or the following detailed description.

Figure 2:
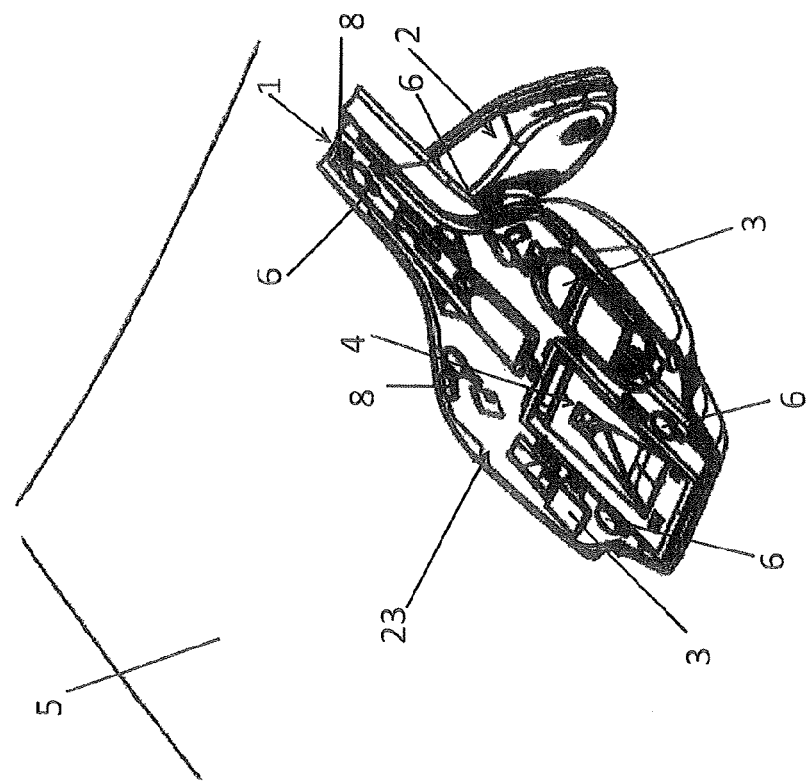
FIG. 2 shows a perspective view of a mounting device attached to a vehicle window pane.
Figure 1:
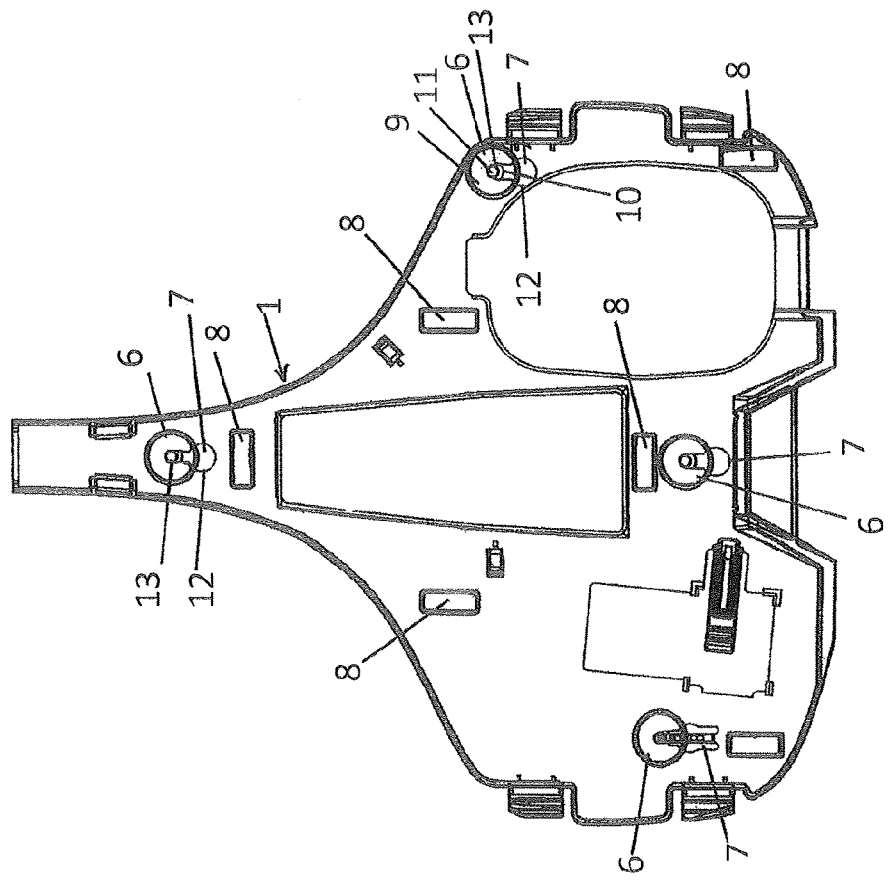
FIG. 1 shows a front view of a mounting device for attaching electrical and electronic modules.

FIG. 1 and FIG. 2 show a top view or a perspective view of various mounting devices 1 for attaching electrical and electronic modules 2, sensors 3 and a camera 4 to the inside of a vehicle window pane 5. The mounting device 1 is shown from the front side 23 in FIG. 2, with which it can be attached to a vehicle window pane 5.

Embodiments relate to a mounting device for attaching holders with the attachment system. The attachment system comprises at least one keyhole with automatic tolerance compensation, in which a pin element, in particular a metal pin element, is receivable. The mounting device is explained with reference to the example of a holding device for attaching electrical and electronic modules to a vehicle window pane. The mounting device is attached by means of at least one such keyhole and e.g. metal pin elements to a vehicle window pane.

The mounting device 1, as shown in the embodiment of FIG. 1 and FIG. 2, is attached with its front side 23 to the vehicle window pane 5 via several pin elements 6, which are received in associated pin openings 7 in the mounting device 1. Furthermore, as shown in FIG. 1 and FIG. 2, additional damping elements 8 are attached to the mounting device 1, which additionally dampen the mounting device 1 in respect of the window pane 5, in order to prevent rattling noises of the mounting device 1 during driving.

Figure 4:
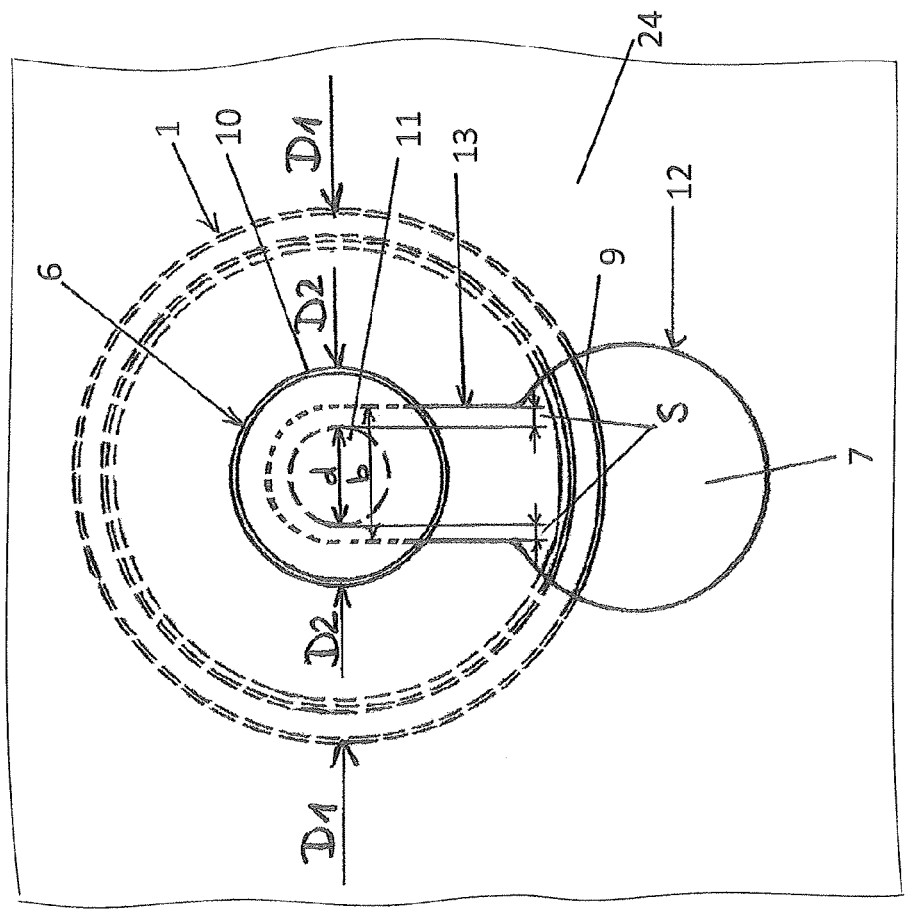
FIG. 4 shows a section of the pin opening and the pin element received therein, according to FIG. 3.
Figure 3:
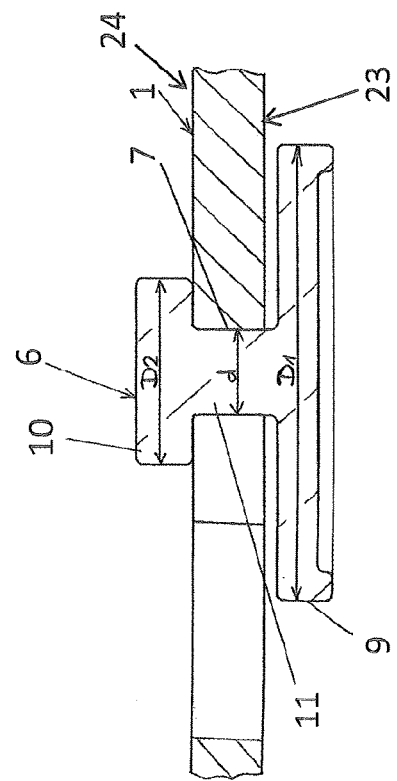
FIG. 3 shows a sectional view of a pin opening and the pin element received therein, according to FIG. 1.

FIG. 3 shows a sectional view of the pin opening 7 and its pin element 6 according to FIG. 1. FIG. 4 again shows a portion of the pin opening 7 and the pin element 6 of FIG. 3 received therein, from the rear side 24. The pin element 6, as shown in FIG. 3 and FIG. 4, shows a head portion 9 with which the pin element 6 is attached, e.g., glued, to the vehicle window pane, in order to attach the mounting device 1 connected thereto with its front side 2 to the vehicle window pane. The pin element 6 further comprises a base portion 10 for attaching and holding the pin element 6 in the pin opening 7 of the mounting device 1. The head portion 9 and the base portion 10 are connected with each via a web portion 11 and are located on the front side 23 or rear side 24 of the mounting device 1. The head portion 9, the base portion 10 and the web 11 are, for example, formed in one piece, e.g., from metal and/or a plastic material.

As shown in FIG. 3 and previously in FIG. 1, the pin opening 7 comprises a portion 12 through which the base portion 10 can be passed through and a second portion 13 connected with the first portion 12 for inserting the web 11. The width b of the second portion 13 is larger than the diameter of the web d and smaller than diameters D1 or D2 of the head portion and base portion 9, 10. In this way the pin element 6 can be retained in the second portion 13 of the opening 7 and not inadvertently slip out of the second portion 13 of the pin opening 7 with its head or base portion 9, 10, as shown in FIG. 4. The diameter D1 of the head portion 9 furthermore is larger than the diameter of the first portion 12, and the diameter D2 of the base portion 10 is smaller than or equal to the diameter of the first portion 12, so that the base portion 10 can be passed into and through the first portion 12 of the pin opening 7, but the head portion 9 cannot.

As shown in FIG. 4 the second portion 13 forms a gap S of approximately 0.25 mm for example, on both sides of the web 11 of the pin element 6. This gap S is provided for mounting the pin element 6 in the pin opening 7 and finally for attaching the mounting device to the vehicle window pane. Despite this it may be unavoidable, in certain circumstances, that the mounting device 1 which is attached to the window pane with pin elements 6 and the shown pin openings 7 rattles during driving or inadvertently moves or squeaks. Moreover it may not be possible, under certain circumstances, to adequately compensate for any occurring design tolerances and position tolerances during positioning and attaching the mounting device 1 with the pin openings 7 and the pin elements 6 received therein.

In the following, in FIG. 5, a front view of the mounting device 1 according to an embodiment is shown. The mounting device 1, with its front side 23, is attached to a vehicle window pane. The mounting device 1 comprises at least one laterally springy pin opening 14 or a keyhole with automatic tolerance compensation. As indicated by an arrow F in FIG. 5, the pin opening 14 is springy both towards the right side and the left side of the mounting device 1. A section of the laterally springy pin opening 14 of the mounting device 1 of FIG. 5 is shown in FIG. 6.

Figure 5:
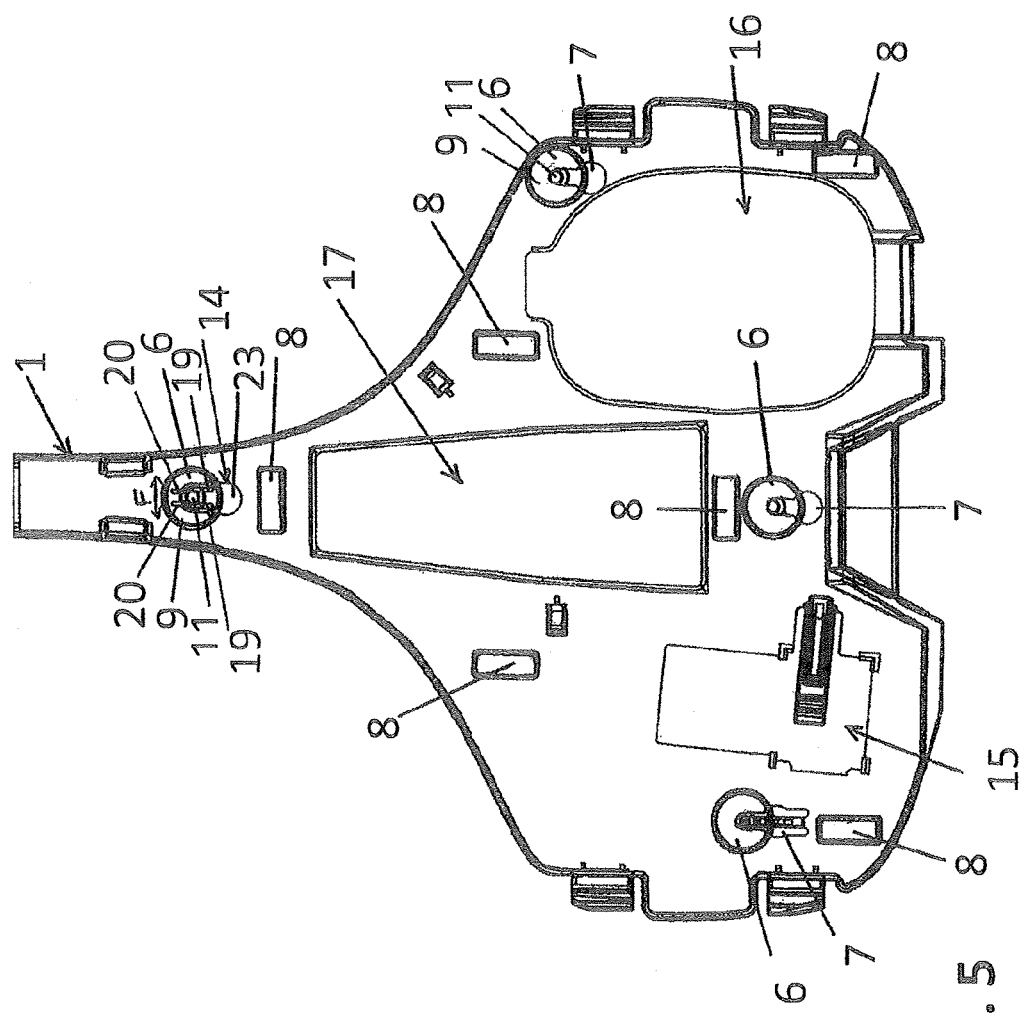
FIG. 5 shows a front view of the mounting device for attaching a rear-view mirror according to an exemplary embodiment.

As revealed in FIG. 5, the mounting device 1 according to an embodiment is different from the mounting devices 1 shown in FIG. 1 to FIG. 4 in that the mounting device 1 comprises at least one laterally springy pin opening 14 or a keyhole with automatic tolerance compensation. The laterally springy pin opening 14 will now described in detail.

Further, the mounting device 1 according to FIG. 5 is of essentially identical construction as the mounting devices 1 of FIG. 1 to FIG. 4 so that in order to avoid unnecessary repetition, the reader is referred to the description of FIG. 1 to FIG. 4. In particular the mounting device 1 according to FIG. 5 comprises a receptacle for attaching electrical and electronic modules, as previously shown in FIG. 2. Optionally the mounting device 1, as shown in the embodiment in FIG. 5, may comprise at least one receptacle, e.g., a receptacle 15, for a first sensor and a receptacle 16 for a second sensor such as a rain sensor, a light sensor, a temperature sensor, a humidity sensor, etc. Further, a receptacle 17 for a camera may be provided. Furthermore, the mounting device 1 comprises at least one or, as illustrated in FIG. 5, two pin openings 7 with pin elements 6, as has previously been described with reference to FIG. 1 to FIG. 4. Optionally one or several damping elements 8 may also be additionally provided, as shown in the embodiment in FIG. 5.

Figure 6:
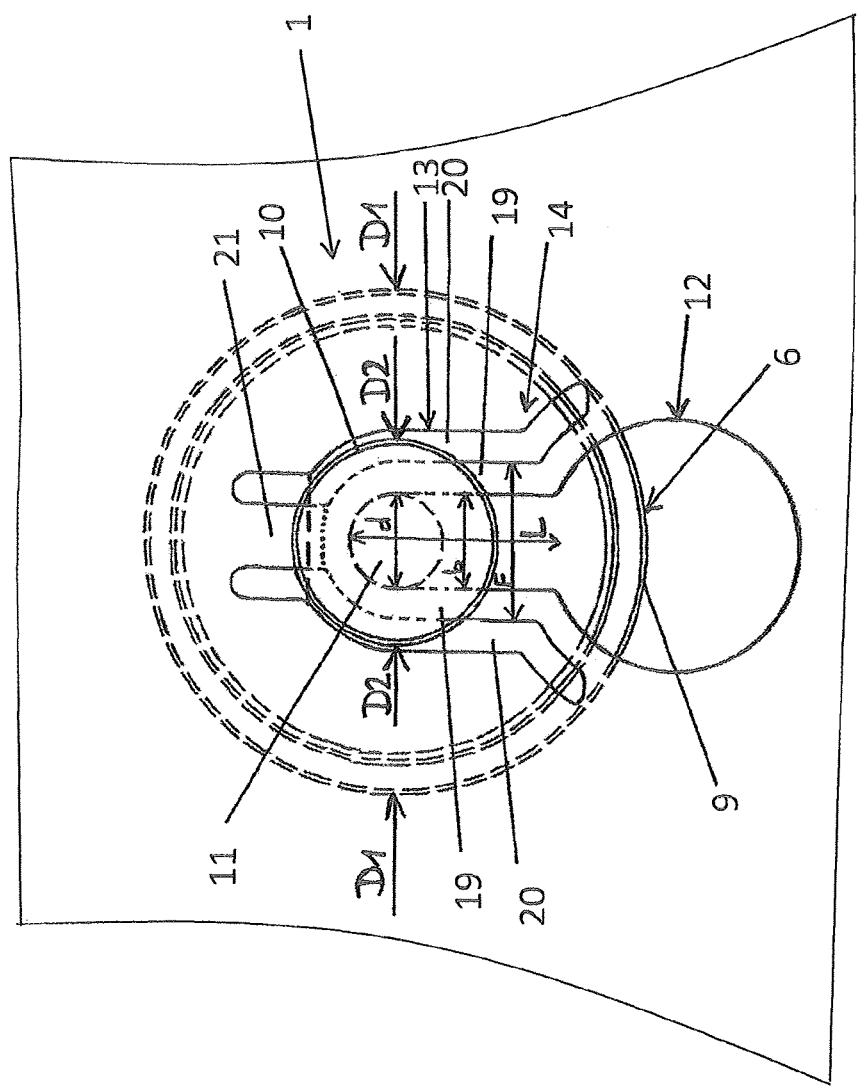
FIG. 6 shows a section of the pin-opening configured to be springy, according to FIG. 5.

The springy pin opening 14, as shown in the embodiment in FIG. 5 and FIG. 6, also comprises a first and a second portion 12, 13. The first portion 12 is configured such that a pin element can be inserted. As revealed in the embodiment of FIG. 5 and FIG. 6, the first portion 12 is, for example, configured such that a pin element 6 can be passed or pushed through the first portion 12 with its base portion, but cannot be passed through with its head portion 9. The diameter D1 of the head portion 9 in this case, is larger than the diameter of the first portion 12, and the diameter D2 of the base portion 10 is smaller than or equal to the diameter of the first portion 12.

Furthermore, the second portion 13 is shaped to receive the pin element. The second portion 13 is shaped, as shown in FIG. 5 and FIG. 6, in such a way that it can receive the web 11 of the pin element 6. The width b of the second portion 13, in the embodiment in FIG. 5 and FIG. 6, is smaller than the diameter D1 of the head portion 9 and smaller than the diameter D2 of the base portion 10 of the pin element 6. As a result the pin element 6 is unable to inadvertently slip out of the second portion 13, but is held by the head portion 9 and the base portion 10 on opposite sides of the mounting device 1, when the pin element 6 is inserted with its web 11 into the second portion 13. The length L of the second portion 13 is, for example, equal to or larger than the diameter d of the web 11 of the pin element 6 so that the web 11 can, e.g., be completely received in the second portion 13 or can be completely pushed into it. The first and second portions 12, 13 of the pin opening 14 are connected with each other in longitudinal direction of the pin opening 14, so that the pin element 6, after it has been passed through the first portion 12 with its base portion 10, can be inserted with a its web 11 into the second portion 13, and the head portion 9 and the base portion 10 are respectively positioned on opposite sides of the mounting device 1.

The springy pin-opening 14, as shown in the embodiment in FIG. 5 and FIG. 6, is limited by a web portion 19 on one or on both longitudinal sides of the second portion 13. The web portion 19 allows lateral springiness, thus allowing the pin opening 14 and the pin element 6 received therein to be springy or movable laterally or in a plane of the mounting device 1, as indicated by an arrow F in FIG. 5 and FIG. 6. The respective web portion 19 is formed by a recess 20, e.g., in the form of a groove or flute, along the second portion 13 of the pin opening 14 in the mounting device 1.

As shown in the embodiment in FIG. 5 and FIG. 6, the two web portions 19 merge, e.g., at the end of the second portion 13 to form a joint web portion 21, which extends in longitudinal direction of the second portion 13. To this end the two recesses 20 extend on both sides of the pin opening 14 in longitudinal direction beyond the end of the second portion 13 opposite the first portion 12. However, the web portions 19 may also end in the area of the end of the second portion 13 and not form a joint web portion 21, as indicated in FIG. 6 by a broke line. Furthermore, instead of, e.g., two web portions 19, a single partially encircling web portion 19 may be provided as shown by a dotted line in FIG. 6. With the partially encircling web portion the recess 20 extends partially circumferentially or encircling the pin opening 14 in circumferential direction. In this case the recess 20 may be provided exclusively encircling the second portion 13 or additionally, as shown, e.g., in FIG. 6, partially encircling the first portion 12.

The width b of the second portion 13 may, for example, be equal to the diameter d or the width of the web 11 of the pin element 6, or the second portion 13 may form a transitional fit together with web 11. The web 11 may comprise a circular cross-section as shown in FIG. 6, or, for example, an angular, e.g., rectangular cross-section or any other cross-sectional shape.

Because there is no gap between the web 11 and the second portion 13, an inadvertent movement or rattling or squeaking of the mounting device 1 can be prevented or at least reduced. Furthermore differences in tolerance, e.g., design tolerances, material tolerances and/or position tolerances of the pin elements 6 and the mounting device 1 can be compensated for during attachment to the vehicle window pane, because the springy pin opening 14 can compensate for these differences in tolerance. As previously described the pin opening 14, through its web portions 19, allows a lateral movement of the pin element 6 received in the springy pin opening 14 or a movement of the same towards the right or the left side of the mounting device 1.

FIG. 7 shows a sectional view through the springy pin opening 14 and its pin elements 6 according to FIG. 5 and FIG. 6. Furthermore FIG. 8 shows a section of the sectional view of the springy pin opening 14 and its pin element 6 according to FIG. 7. As shown in FIG. 7 and FIG. 8, a web portion 19 of the second portion 13 of the springy pin opening 14 may be even or planar on at least one side, as indicated by a dotted line in the embodiment in FIG. 8, or may be arched towards the front side or rear side of the mounting device 1. The pin opening 14 may also be configured to be springy not just laterally but additionally towards the front side 23 and/or the rear side 24 of the mounting device 1, as indicated by an arrow P in FIG. 7 and FIG. 8.

In order to be springy towards the front side 23 and the rear side 24 of the mounting device 1, the respective web portion 19 is additionally arched towards the front side or, as shown in the embodiment in FIG. 7 and FIG. 8, towards the rear side of the mounting device 1. The arched portion 22 of the web portion 19 is for example shown arched in the embodiment in FIG. 7 and FIG. 8 towards the rear side of the mounting device 1. As a result the web portion 19 of the pin opening 14 and the pin element 6 received therein may be springy in direction of the front side and the rear side of the mounting device 1 and may compensate for differences in tolerance, such as position tolerances, design tolerances and/or material tolerances of the mounting device 1.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A mounting device for attaching a module to a vehicle window pane, comprising:
 a front side; and
 a pin element that is configured to attach the front side to the vehicle window pane;
 a laterally springy pin opening that is configured to receive the pin element, the pin opening including a first portion and a second portion, with a first web portion and a second web portion defined along the second portion of the pin opening in a longitudinal direction by two recesses that extend along the second portion to an area beyond an end of the second portion, with each of the first web portion and the second web portion extending from an opposite side of the second portion and coupled together at the end of the second portion to partially encircle the second portion of the pin opening.

2. The mounting device according to claim 1, wherein the laterally springy pin opening is further configured to spring towards the front side and a rear side of the mounting device.

3. The mounting device according to claim 1, wherein:
the first portion is configured to insert into the pin element; and
the second portion is connected with the first portion in the longitudinal direction that is configured to receive the pin element.

4. The mounting device according to claim 3, wherein the first web portion and the second web portion allows the pin opening to be springy.

5. The mounting device according to claim 4, wherein the two recesses extend at least along a partial length of the second portion of the pin opening.

6. The mounting device according to claim 4, wherein the first web portion and the second web portion are substantially evenly formed.

7. The mounting device according to claim 4,
wherein one of the first web portion or the second web portion is arched towards the front side, and
wherein the one of the first web portion and the second web portion is springy towards the front and a rear side of the mounting device.

8. The mounting device according to claim 1,
wherein the two recesses each extend beyond the end of the second portion facing away from the first portion, and
wherein the first web portion and the second web portion formed by the two recesses merge at the end of the second portion to firm a joint web portion.

9. The mounting device according to claim 1,
wherein the two recesses are formed to encircle only the second portion and partially encircle the first portion.

10. The mounting device according to claim 9, wherein a width of the second portion is substantially equal to a diameter of a web of the pin element, which is received in the second portion.

11. The mounting device according to claim 1, wherein the mounting device comprises an additional receptacle that is configured to receive a sensor.

12. The mounting device according to claim 1, wherein the mounting device comprises a damping element on the front side.

13. The mounting device according to claim 1, wherein the mounting device comprises an additional receptacle that is configured to receive a camera.

14. The mounting device according to claim 1, wherein the module is a mechanical module.

15. The mounting device according to claim 1, wherein the module is an electrical module.

16. The mounting device according to claim 1, wherein the module is an electronic module.

17. A mounting device for attaching a module to a vehicle window pane, comprising:
a front side; and
a pin element that is configured to attach the front side to the vehicle window pane;
a laterally springy pin opening that is configured to receive the pin element, the pin opening including a first portion that enables the pin element to be received, and a second portion in communication with the first portion, with a first web portion and a second web portion defined along a length of the second portion of the pin opening in a longitudinal direction by two opposed recesses that extend along the second portion to an area beyond an end of the second portion opposite the first portion, with each of the first web portion and the second web portion extending from an opposite side of the second portion and coupled together at the end of the second portion to partially encircle the second portion of the pin opening.

* * * * *